United States Patent
O'Donnell et al.

(10) Patent No.: US 6,620,520 B2
(45) Date of Patent: Sep. 16, 2003

(54) ZIRCONIA TOUGHENED CERAMIC COMPONENTS AND COATINGS IN SEMICONDUCTOR PROCESSING EQUIPMENT AND METHOD OF MANUFACTURE THEREOF

(75) Inventors: Robert J. O'Donnell, Alameda, CA (US); Christopher C. Chang, Sunnyvale, CA (US); John E. Daugherty, Alameda, CA (US)

(73) Assignee: Lam Research Corporation, Fremont, CA (US)

( * ) Notice: Subject to any disclaimer, the term of this patent is extended or adjusted under 35 U.S.C. 154(b) by 81 days.

(21) Appl. No.: 09/750,056

(22) Filed: Dec. 29, 2000

(65) Prior Publication Data

US 2002/0086153 A1 Jul. 4, 2002

(51) Int. Cl.⁷ .................. B32B 15/04; H01L 21/00; C23C 16/00

(52) U.S. Cl. ............... 428/469; 438/9; 118/715

(58) Field of Search .............................................. 438/9

(56) References Cited

U.S. PATENT DOCUMENTS

| | | |
|---|---|---|
| 4,340,462 A | 7/1982 | Koch |
| 4,491,496 A | 1/1985 | Laporte et al. |
| 4,702,970 A | 10/1987 | Sarin et al. |
| 4,751,109 A | 6/1988 | Sarin et al. |
| 4,948,458 A | 8/1990 | Ogle |
| 5,200,232 A | 4/1993 | Tappan et al. |
| 5,262,029 A | 11/1993 | Erskine et al. |
| 5,358,645 A | 10/1994 | Hong et al. |
| 5,472,920 A | 12/1995 | Dubois et al. |
| 5,494,558 A | 2/1996 | Bunshah et al. |
| 5,522,932 A | 6/1996 | Wong et al. |
| 5,558,903 A | 9/1996 | Bhushan et al. |
| 5,597,495 A | 1/1997 | Keil et al. |
| 5,641,375 A | 6/1997 | Nitescu et al. |
| 5,680,013 A | 10/1997 | Dornfest et al. |

(List continued on next page.)

FOREIGN PATENT DOCUMENTS

| | | |
|---|---|---|
| EP | 0908425 A1 | 4/1999 |
| JP | 62-103379 | 5/1987 |
| JP | 2000191369 | 7/2000 |

OTHER PUBLICATIONS

Notification of Transmittal of the International Search Report or the Declaration for PCT/US01/43149 dated May 22, 2002.

Introduction to Ceramics, 2$^{nd}$ Edition, by W.D. Kingery, H.K. Bowen, and D.R. Uhlmann (J. Wiley & Sons, New York 1976) (copy of Contents) No month.

(List continued on next page.)

Primary Examiner—Deborah Jones
Assistant Examiner—G. A. Blackwell-Rudasill
(74) Attorney, Agent, or Firm—Burns, Doane, Swecker & Mathis, LLP

(57) ABSTRACT

A corrosion resistant component of semiconductor processing equipment such as a plasma chamber comprises zirconia toughened ceramic material as an outermost surface of the component. The component can be made entirely of the ceramic material or the ceramic material can be provided as a coating on a substrate such as aluminum or aluminum alloy, stainless steel, or refractory metal. The zirconia toughened ceramic can be tetragonal zirconia polycrystalline (TZP) material, partially-stabilized zirconia (PSZ), or a zirconia dispersion toughened ceramic (ZTC) such as zirconia-toughened alumina (tetragonal zirconia particles dispersed in $Al_2O_3$). In the case of a ceramic zirconia toughened coating, one or more intermediate layers may be provided between the component and the ceramic coating. To promote adhesion of the ceramic coating, the component surface or the intermediate layer surface may be subjected to a surface roughening treatment prior to depositing the ceramic coating.

11 Claims, 2 Drawing Sheets

U.S. PATENT DOCUMENTS

| | | |
|---|---|---|
| 5,788,799 A | 8/1998 | Steger et al. |
| 5,798,016 A | 8/1998 | Oehrlein et al. |
| 5,820,723 A | 10/1998 | Benjamin et al. |
| 5,824,605 A | 10/1998 | Chen et al. |
| 5,827,572 A | 10/1998 | Song et al. |
| 5,838,529 A | 11/1998 | Shufflebotham et al. |
| 5,851,299 A | 12/1998 | Cheng et al. |
| 5,863,376 A | 1/1999 | Wicker et al. |
| 5,879,523 A | 3/1999 | Wang et al. |
| 5,885,356 A | 3/1999 | Zhao et al. |
| 5,895,586 A | 4/1999 | Kaji et al. |
| 5,900,283 A | 5/1999 | Vakil et al. |
| 5,910,462 A | 6/1999 | Gani et al. |
| 6,027,792 A | 2/2000 | Yamamoto et al. |
| 6,048,798 A | 4/2000 | Gadgil et al. |
| 6,074,488 A | 6/2000 | Roderick et al. |
| 6,106,959 A | 8/2000 | Vance et al. |
| 6,110,604 A | 8/2000 | Rickerby |
| 6,117,560 A | 9/2000 | Maloney |
| 6,123,997 A | 9/2000 | Schaeffer et al. |
| 6,383,964 B1 * | 5/2002 | Nakahara et al. ............ 501/152 |
| 6,391,146 B1 * | 5/2002 | Bhatnagar et al. ........... 118/715 |

OTHER PUBLICATIONS

The Science and Engineering of Thermal Spray Coating by Lech Pawlowski (John Wiley & Sons, New York 1995) (copy of Contents) No month.

Stecura, "Effects of Yttrium, Aluminum and Chromium Concentrations in Bond Coatings on the Performance of Zirconia–Yttria Thermal Barriers", Thin Solid Films, 73:481–489 (1980) (copy to be supplied at a later date) No month.

Engineering Materials Handbook, vol. 4, Ceramics and Glass, pp. 775–786 (ASM International, 1991). No month.

The Science and Engineering of Thermal Spray Coating by Pawlowski (John Wiley, 1995) (copy to be supplied at a later date) No month.

Written Opinion for PCT/US01/43149 dated Aug. 8, 2002.

* cited by examiner

ZIRCONIA TOUGHENED CERAMIC COMPONENTS AND COATINGS IN SEMICONDUCTOR PROCESSING EQUIPMENT AND METHOD OF MANUFACTURE THEREOF

BACKGROUND OF THE INVENTION

1. Field of the Invention

The present invention relates generally to the fabrication of semiconductor wafers, and, more particularly, to high density plasma etching chambers having internal surfaces that reduce particle and metallic contamination during processing.

2. Description of the Related Art

In the field of semiconductor processing, vacuum processing chambers are generally used for etching and chemical vapor depositing (CVD) of materials on substrates by supplying an etching or deposition gas to the vacuum chamber and application of an RF field to the gas to energize the gas into a plasma state. Examples of parallel plate, transformer coupled plasma (TCP™) which is also called inductively coupled plasma (ICP), and electron-cyclotron resonance (ECR) reactors and components thereof are disclosed in commonly owned U.S. Pat. Nos. 4,340,462; 4,948,458; 5,200,232 and 5,820,723. Because of the corrosive nature of the plasma environment in such reactors and the requirement for minimizing particle and/or heavy metal contamination, it is highly desirable for the components of such equipment to exhibit high corrosion resistance.

During processing of semiconductor substrates, the substrates are typically held in place within the vacuum chamber by substrate holders such as mechanical clamps and electrostatic clamps (ESC). Examples of such clamping systems and components thereof can be found in commonly owned U.S. Pat. Nos. 5,262,029 and 5,838,529. Process gas can be supplied to the chamber in various ways such as by a gas distribution plate. An example of a temperature controlled gas distribution plate for an inductively coupled plasma reactor and components thereof can be found in commonly owned U.S. Pat. No. 5,863,376. In addition to the plasma chamber equipment, other equipment used in processing semiconductor substrates include transport mechanisms, gas supply systems, liners, lift mechanisms, load locks, door mechanisms, robotic arms, fasteners, and the like. Various components of such equipment are subject to corrosive conditions associated with semiconductor processing. Further, in view of the high purity requirements for processing semiconductor substrates such as silicon wafers and dielectric materials such as the glass substrates used for flat panel displays, components having improved corrosion resistance are highly desirable in such environments.

Aluminum and aluminum alloys are typically used for walls, electrodes, substrate supports, fasteners and other components of plasma reactors. In order to prevent corrosion of the such metal components, various techniques have been proposed for coating the aluminum surface with various coatings. For instance, U.S. Pat. No. 5,641,375 discloses that aluminum chamber walls have been anodized to reduce plasma erosion and wear of the walls. The '375 patent states that eventually the anodized layer is sputtered or etched off and the chamber must be replaced. U.S. Pat. No. 5,895,586 discloses that a technique for forming a corrosion resistant film of $Al_2O_3$, AlC, TiN, TiC, AlN or the like on aluminum material can be found in Japanese Application Laid-Open No. 62-103379. U.S. Pat. No. 5,680,013 states that a technique for flame spraying $Al_2O_3$ on metal surfaces of an etching chamber is disclosed in U.S. Pat. No. 4,491,496. The '013 patent states that the differences in thermal expansion coefficients between aluminum and ceramic coatings such as aluminum oxide leads to cracking of the coatings due to thermal cycling and eventual failure of the coatings in corrosive environments. U.S. Pat. No. 5,879,523 discloses a sputtering chamber wherein a thermally sprayed coating of $Al_2O_3$ is applied to a metal such as stainless steel or aluminum with an optional $NiAl_x$ bond coating therebetween. U.S. Pat. No. 5,522,932 discloses a rhodium coating for metal components of an apparatus used for plasma processing of substrates with an optional nickel coating therebetween.

Materials for chamber walls, liners, rings and other parts of plasma chambers have also been proposed. See, for example, U.S. Pat. Nos. 5,366,585; 5,788,799; 5,798,016; 5,851,299 and 5,885,356.

As integrated circuit devices continue to shrink in both their physical size and their operating voltages, their associated manufacturing yields become more susceptible to particle and metallic impurity contamination. Consequently, fabricating integrated circuit devices having smaller physical sizes requires that the level of particulate and metal contamination be less than previously considered to be acceptable.

In view of the foregoing, there is a need for high density plasma processing chambers having internal, plasma exposed surfaces that are more resistant to erosion and assist in minimizing contamination (e.g., particles and metallic impurities) of the wafer surfaces being processed.

SUMMARY OF THE INVENTION

In a first embodiment of the present invention, a process of making a component of semiconductor processing equipment is provided. The process includes providing a zirconia toughened ceramic coating on a surface of the component such that the zirconia toughened ceramic coating forms an outermost surface of the component.

In a second embodiment of the present invention, a component of semiconductor processing equipment is provided wherein the component includes a zirconia toughened ceramic forming an outermost surface of the component. A plasma chamber including at least one component as set forth above is also provided.

In a third embodiment of the present invention, a method of processing a semiconductor substrate in a plasma chamber as set forth above is provided. In the method according to the present invention, a substrate is transferred into the plasma chamber and an exposed surface of the substrate is processed with a plasma. In a further preferred embodiment of the present invention, the method includes steps of: positioning the substrate on a substrate support in the reactor; introducing a process gas into the reactor; applying RF energy to the process gas to generate a plasma adjacent an exposed surface of the substrate; and etching the exposed substrate surface with a plasma.

BRIEF DESCRIPTION OF THE DRAWINGS

The invention will be described in greater detail with reference to accompanying drawings in which like elements bear like reference numerals, and wherein.

DETAILED DESCRIPTION OF THE PREFERRED EMBODIMENTS OF THE INVENTION

Figure 1:
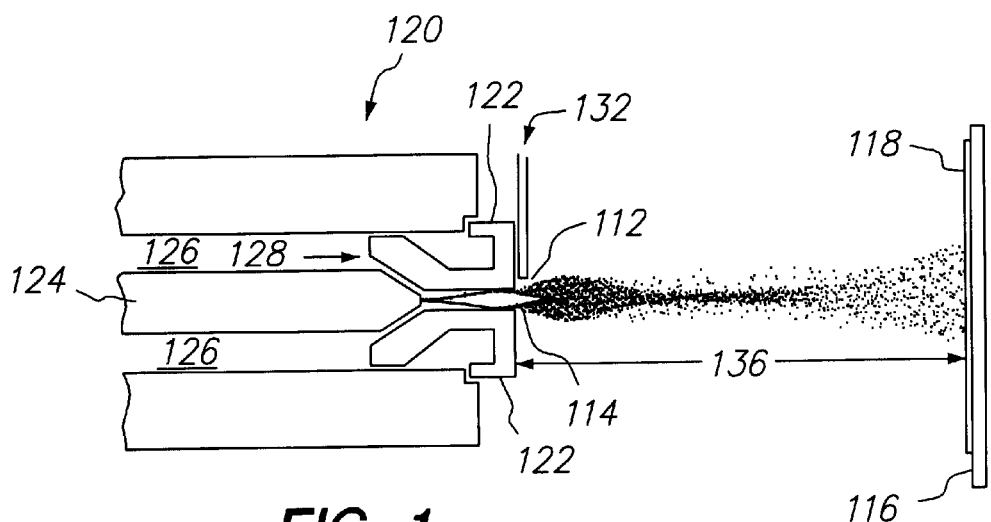
FIG. 1 illustrates a conventional plasma spray process.

The present invention provides an effective way to provide corrosion resistance to the surfaces of components of semiconductor processing apparatus such as parts of a plasma processing reactor chamber. Such components include chamber walls, substrate supports, gas distribution systems (including showerheads, baffles, rings, nozzles, etc.), fasteners, heating elements, plasma screens, liners, transport module components, such as robotic arms, fasteners, inner and outer chamber walls, etc., and the like. In the present invention, the components themselves can be made from a zirconia toughened ceramic or the plasma exposed surfaces of the components can be coated or otherwise covered with a zirconia toughened ceramic material.

Zirconia toughened ceramic materials are a class of materials which utilize the tetragonal to mono-clinic phase transformation of metastable tetragonal zirconia particles to improve the strength and toughness of the ceramic. Under ambient pressure, zirconia has three polymorphic forms: monoclinic, tetragonal and cubic. Cubic zirconia is stable in the range from the melting point of zirconia to about 2370° C.; tetragonal zirconia is stable in the range from about 2370° C. to about 1120° C.; and monoclinic zirconia is stable in the temperature range below about 1120° C. The phase transformation from tetragonal to monoclinic is accompanied by 3–5% volume expansion and about 8% shear displacement. Thus, when cooling pure zirconia from a high temperature, cracks may form.

However, if a stabilizer such as MgO, CaO, $Y_2O_3$, $CeO_2$ or $TiO_2$ is added to zirconia, a transformable tetragonal phase can be formed even at room temperature. Ceramics comprising transformable tetragonal $ZrO_2$ are called transformation-toughened ceramics because they use the stress-induced phase transformation of zirconia to improve the strength and toughness of the ceramic. These materials are widely used in structural applications where high strength and high toughness are required. The stress-induced phase transformation occurs when tetragonal zirconia existing as a meta-stable phase at room temperature absorbs energy by transforming into a monoclinic phase driven by the shear stress at a propagating crack front.

Zirconia toughened ceramics which utilize the stress-induced phase transformation of zirconia as described above include:

1) partially stabilized zirconia (PSZ) which can be prepared by adding a stabilizer such as MgO, CaO and $Y_2O_3$ to zirconia to form a cubic phase and then heat treating the cubic zirconia to precipitate fine tetragonal particles;

2) tetragonal zirconia polycrystals (TZP) in which all zirconia particles are tetragonal, prepared by adding approximately 2–3 mol % of $Y_2O_3$ or 10–12 mol % of $CeO_2$ to zirconia and sintering or otherwise heat treating at a condition where the tetragonal phase is stable; and 3) zirconia dispersion toughened ceramics (ZTC) prepared by dispersing tetragonal zirconia in other ceramics such as alumina, etc. Zirconia toughened ceramics are described in *Engineered Materials Handbook, Vol. 4, Ceramics and Glass*, pp. 775–786 (ASM International, 1991).

In order to minimize contamination of substrates processed in equipment incorporating one or more components according to the invention, it is desirable for the zirconia toughened ceramic material to be as pure as possible, e.g., include minimal amounts of contaminating elements such as transition metals, alkali metals or the like. For example, the zirconia toughened ceramic material can be made pure enough to avoid on-wafer contamination of $10^5$ atoms/$cm^2$ or higher.

The present inventors have discovered that zirconia toughened ceramics have desirable properties for use in semiconductor processing equipment such as plasma etch chambers. In particular, zirconia toughened ceramics provide erosion resistant surfaces that can reduce the levels of particulate contamination in plasma reactor chambers. The toughening mechanism of the zirconia toughened ceramics can also reduce the tendency of the ceramic coating to crack during thermal cycling.

In a preferred embodiment of the invention, the zirconia toughened ceramic material is provided as a coating. A preferred coating method is thermal spraying in which ceramic powder is melted and incorporated in a gas stream directed at the component being spray coated. An advantage of thermal spraying techniques is that the component is coated only on the sides facing the thermal spray gun, and masking can be used to protect other areas. Conventional thermal spraying techniques, including plasma spraying, are addressed in *The Science and Engineering of Thermal Spray Coating by Pawlowski* (John Wiley, 1995), the contents of which are hereby incorporated by reference.

A particularly preferred thermal spraying method is plasma spraying which allows intricate interior surfaces of the chamber or other chamber components to be coated. FIG. 1 illustrates a typical plasma spraying process. The coating material, usually in the form of a powder 112, is injected into a high temperature plasma flame 114 where it is rapidly heated and accelerated to a high velocity. The hot material impacts on the substrate surface 116 and rapidly cools to form a coating 118. As a result, the as-sprayed surface is generally rough and textured.

The plasma spray gun 120 typically comprises a copper anode 122 and tungsten cathode 124, both of which are water cooled. Plasma gas 126 (argon, nitrogen, hydrogen, helium) flows around the cathode in the direction generally indicated by arrow 128 and through anode 122 which is shaped as a constricting nozzle. The plasma is initiated by a high voltage discharge which causes localized ionization and a conductive path for a DC arc to form between the cathode 124 and the anode 122. Resistance heating from the arc causes the gas to reach extreme temperatures, dissociate and ionize to form a plasma. The plasma exits the anode nozzle 122 as a free or neutral plasma flame (plasma which does not carry electric current). When the plasma is stabilized ready for spraying, the electric arc extends down the nozzle. Powder 112 is fed into the plasma flame usually via an external powder port 132 mounted near the anode nozzle exit. The powder 112 is so rapidly heated and accelerated that the spray distance 136 (the distance between the nozzle tip and the substrate surface) can be on the order of 125 to 150 mm. Plasma sprayed coatings are thus produced by a process in which molten or heat-softened particles are caused to impact on a substrate.

In the present invention, surface preparation techniques such as cleaning and grit or bead blasting can be used to provide a more chemically and physically active surface for bonding. Prior to coating, the surface of the substrate is preferably thoroughly cleaned to remove surface material such as oxides or grease. Further, the surface can be roughened by known methods such as grit blasting prior to coating. By grit blasting, the surface area available for bonding can be increased which can increase the coating bond strength. The rough surface profile can also promote mechanical keying or interlocking of the coating with the substrate. For aluminum reactor components, it is particularly desirable to roughen the component surface, anodize the roughened component surface and again roughen the anodized surface prior to application of the zirconia toughened ceramic coating.

Figure 2:
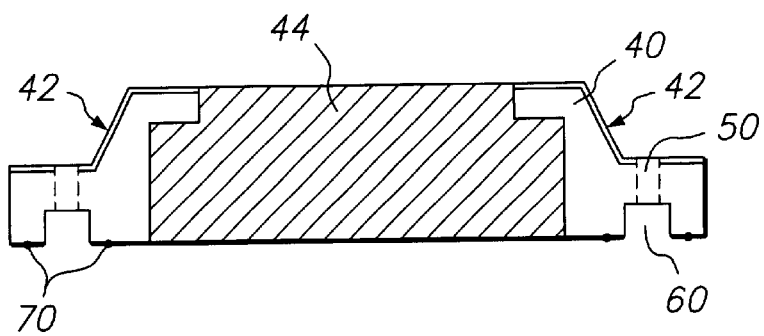
FIG. 2 shows a cross-sectional view of a gas ring apparatus for a polysilicon etching apparatus according to one embodiment of the present invention.

In a preferred embodiment of the invention, the zirconia toughened ceramics components are used as components in a polysilicon high-density plasma reactor. An exemplary reactor of this type is the TCP 9400™ plasma etch reactor available from LAM Research Corporation of Fremont, Calif. In the TCP 9400™ reactor, processing gases (such as $Cl_2$, HBr, $CF_4$, $CH_2F_2$, $O_2$, $N_2$, Ar, $SF_6$ and $NF_3$) are conducted into a gas ring located on the bottom of the etch chamber and are then guided through gas holes into the reactor chamber. FIG. 2 shows a cross-sectional view of a gas ring for a polysilicon etch reactor according to the present invention. As shown in FIG. 2, the main body of the gas ring 40 surrounds a substrate support 44. The bottom surface of the gas ring 40 contains a ring-shaped gas-guiding trench 60. The aforementioned gas holes 50 extend into the gas-guiding trench 60.

The gas ring is typically composed of aluminum. The upper surfaces of the gas ring are directly exposed to the plasma and are thus subject to erosion. To protect these surfaces, the gas ring is typically covered with an aluminum oxide layer which is typically formed by anodizing the surface of the gas ring. The anodized coating, however, is relatively brittle and has a tendency to crack during repeated thermal cycling of the reactor during use. The cracks which form in the anodized layer can allow the corrosive process gases to attack the underlying aluminum layer reducing part life and contributing to metallic and particle contamination of processed substrates such as wafers, flat panel display substrates, etc.

According to the present invention, the exposed surfaces of the gas ring can be covered with a coating 42 of a zirconia toughened ceramic material. The zirconia toughened ceramic can be coated on a bare (with or without a native oxide surface film) aluminum layer or on an aluminum oxide layer (e.g., aluminum having an anodized surface). The coating is preferably applied using a plasma spray process but other coating methods suitable for use with ceramic materials may also be employed. When coating the gas ring, the coating can be allowed to partially penetrate into the gas holes to coat and protect the inside walls thereof. However, the coating material should not be applied in such a manner as to obstruct the openings. Therefore, the gas holes can be plugged or masked during the coating process.

Other components of the polysilicon etch reactor which can be exposed to the plasma during processing can also be coated with a zirconia toughened ceramic material according to the present invention. These components include chamber walls, chamber liners, an electrostatic chuck and the dielectric window opposite the substrate. Providing a coating of zirconia toughened ceramic material on the upper surface of the electrostatic chuck provides additional protection to the chuck during cleaning cycles in which a wafer is not present and the upper surface of the chuck is thus directly exposed to the plasma.

The reactor components of the present invention can also be used in a high-density oxide etch process. An exemplary oxide etch reactor is the TCP 9100™ plasma etch reactor available from LAM Research Corporation of Fremont, Calif. In the TCP 9100™ reactor, the gas distribution plate is a circular plate situated directly below the TCP™ window which is also the vacuum sealing surface at the top of the reactor in a plane above and parallel to a semiconductor wafer. The gas distribution plate is sealed using an O-ring to a gas distribution ring located at the periphery of the gas distribution plate. The gas distribution ring feeds gas from a source into the volume defined by the gas distribution plate, an inside surface of a window underlying an antenna in the form of a flat spiral coil supplying RF energy into the reactor, and the gas distribution ring. The gas distribution plate contains an array of holes of a specified diameter which extend through the plate. The spatial distribution of the holes through the gas distribution plate can be varied to optimize etch uniformity of the layers to be etched, e.g., a photoresist layer, a silicon dioxide layer and an underlayer material on the wafer. The cross-sectional shape of the gas distribution plate can be varied to manipulate the distribution of RF power into the plasma in the reactor. The gas distribution plate material is dielectric to enable coupling of this RF power through the gas distribution plate into the reactor. Further, it is desirable for the material of the gas distribution plate to be highly resistant to chemical sputter-etching in environments such as oxygen or a hydro-fluorocarbon gas plasma in order to avoid breakdown and the resultant particle generation associated therewith.

Figure 3:
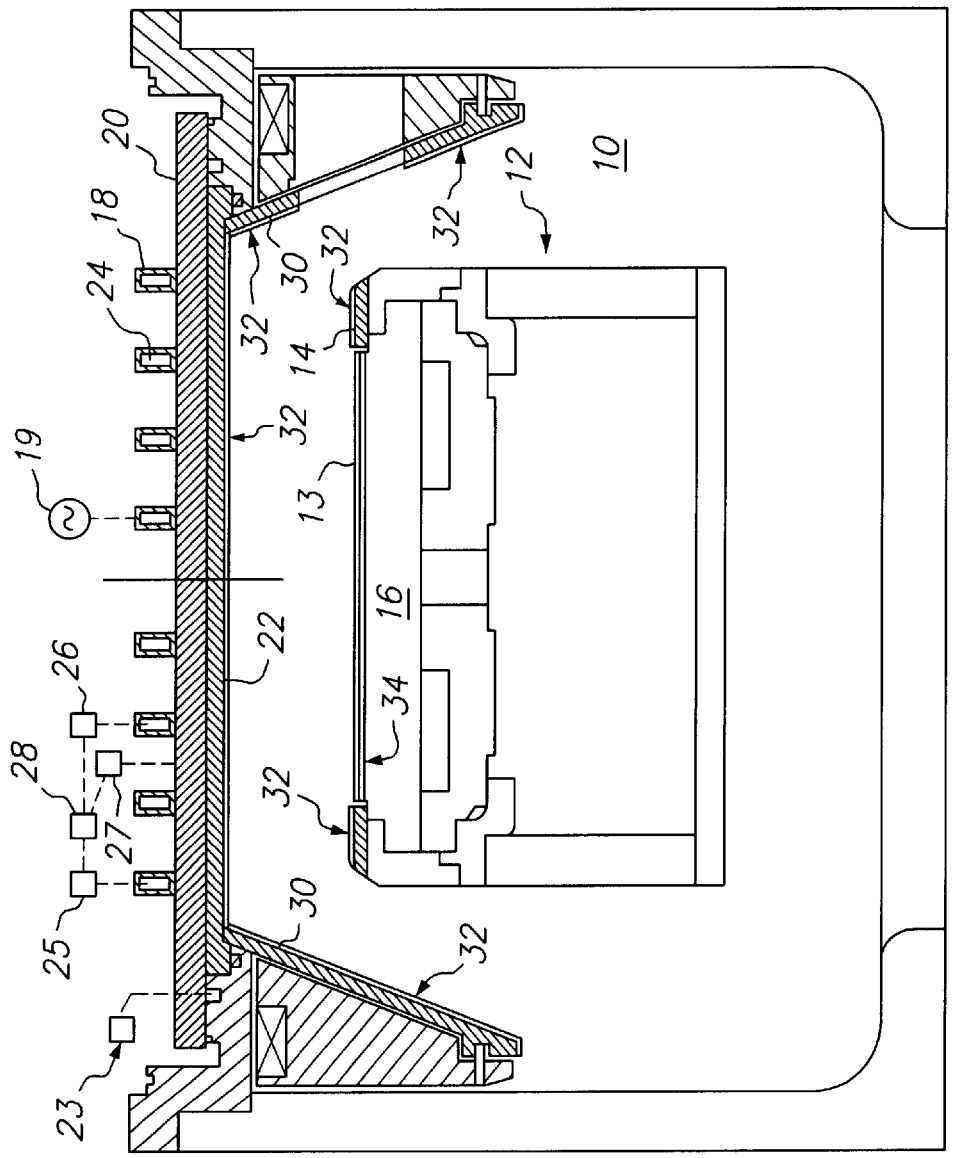
FIG. 3 shows a high density oxide etch chamber containing components according to the present invention.

FIG. 3 illustrates a plasma reactor of the aforementioned type. The reactor comprises a reactor chamber 10 that includes a substrate holder 12 including an electrostatic chuck 34 which provides a clamping force to a substrate 13 as well as an RF bias to a substrate. The substrate can be back-cooled using a heat transfer gas such as helium. A focus ring 14 comprises a dielectric outer ring and an inner ring which confines plasma in an area above the substrate. A source of energy for maintaining a high density (e.g., $10^{11}$–$10^{12}$ ions/cm$^3$) plasma in the chamber such as an antenna 18 powered by a suitable RF source to provide a high density plasma is disposed at the top of reactor chamber 10. The chamber includes suitable vacuum pumping apparatus for maintaining the interior of the chamber at a desired pressure (e.g., below 50 mTorr, typically 1–20 mTorr).

A substantially planar dielectric window 20 of uniform thickness provided between the antenna 18 and the interior of the processing chamber 10 forms the vacuum wall at the top of the processing chamber 10. A gas distribution plate 22 is provided beneath window 20 and includes openings such as circular holes for delivering process gas from the gas supply 23 to the chamber 10. A conical liner 30 extends from the gas distribution plate and surrounds the substrate holder 12. The antenna 18 can be provided with a channel 24 through which a temperature control fluid is passed via inlet and outlet conduit 25, 26. However, the antenna 18 and/or window 20 need not be cooled or could be cooled by other techniques such as by blowing air over the antenna and window, passing a cooling medium through or in heat transfer contact with the window and/or gas distribution plate, etc.

In operation, a semiconductor substrate such as a silicon wafer is positioned on the substrate holder 12 and held in place by an electrostatic chuck 34. Other clamping means, however, such as a mechanical clamping mechanism can also be used. Additionally, helium back-cooling can be employed to improve heat transfer between the substrate and chuck. Process gas is then supplied to the vacuum processing chamber 10 by passing the process gas through a gap between the window 20 and the gas distribution plate 22. Suitable gas distribution plate arrangements (i.e., showerhead) arrangements are disclosed in commonly owned U.S. Pat. Nos. 5,824,605; 6,048,798; and 5,863,376. A high density plasma is ignited in the space between the substrate and the window by supplying suitable RF power to the antenna 18.

In FIG. 3, the internal surfaces of reactor components such as the gas distribution plate 22, the chamber liner 30, the electrostatic chuck 34, and the focus ring 14 are shown coated with a coating 32 of a zirconia toughened ceramic material. However, any or all of these surfaces can be provided with a zirconia toughened ceramic coating according to the present invention.

The high density polysilicon and dielectric etch chambers described above are only exemplary of plasma etch reactors which can incorporate components according to the present invention. The zirconia toughened ceramic components of the present invention can be used in any etch reactor (e.g., a metal etch reactor) or other type of semi-conductor processing equipment where plasma erosion is a problem.

Other components which may be provided with zirconia toughened ceramic coatings include chamber walls (typically made from aluminum having an anodized or non-anodized surface), substrate holders, fasteners, etc. These parts are typically made from metal (e.g., aluminum) or ceramic (e.g., alumina). These plasma reactor components are typically exposed to plasma and often show signs of corrosion. Other parts which can be coated in accordance with the present invention may not be directly exposed to plasma but instead are exposed to corrosive gases such as gases emitted from processed wafers or the like. Therefore, other equipment used in processing semiconductor substrates can also be provided with zirconia toughened ceramic surfaces according to the present invention. Such equipment can include transport mechanisms, gas supply systems, liners, lift mechanisms, load locks, door mechanisms, robotic arms, fasteners, and the like.

Examples of metals and/or alloys that can be coated with a zirconia toughened ceramic material according to the present invention include aluminum, stainless steel, refractory metals, e.g., "HAYNES 242" "Al-6061", "SS 316". Since the zirconia toughened ceramic material forms a corrosion resistant coating over the component, the underlying component is no longer directly exposed to the plasma and aluminum alloys can be used without regard to alloying additions, grain structure or surface conditions. Additionally, various ceramic or polymeric materials may also be coated with a zirconia toughened ceramic material according to the present invention. In particular, the reactor components can be made from ceramic materials such as alumina ($Al_2O_3$), silicon carbide (SiC), silicon nitride ($Si_3N_4$), boron carbide ($B_4C$) and/or boron nitride (BN).

Figure 4:
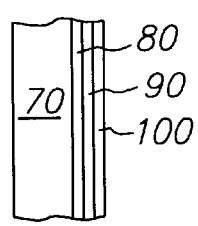
FIG. 4 shows details of an embodiment of the corrosion resistant coating according to the present invention.

If desired, one or more intermediate layers of material can be provided between the zirconia toughened ceramic coating and the surface of the component. FIG. 4 shows a coated component according to a preferred embodiment of the present invention. As shown in FIG. 4, a first intermediate coating 80 is optionally coated on a reactor component 70 by a conventional technique. The optional first intermediate coating 80 is sufficiently thick to adhere to the substrate and to further allow it to be processed prior to forming the optional second intermediate coating 90 or the zirconia toughened ceramic coating described below. The first intermediate coating 80 can have any suitable thickness such as a thickness of at least about 0.001 inches, preferably from about 0.001 to about 0.25 inches, more preferably between 0.001 and 0.15 inches and most preferably from 0.001 inches to 0.05 inches.

After depositing the optional first intermediate coating 80 onto the reactor component 70, the plating can be blasted or roughened by any suitable technique, and then overcoated with the second optional coating 90 or the zirconia toughened ceramic coating 100. A roughened layer 80 provides a particularly good bond. Desirably, the second intermediate coating 90 imparts a high mechanical compression strength to the coating 80 and minimizes formation of fissures in the coating 90.

The optional second intermediate coating 90 is sufficiently thick to adhere to the first intermediate coating 80 and to further allow it to be processed prior to forming any additional intermediate coatings or the outer zirconia toughened ceramic containing coating 100 described below. The second intermediate coating 90 can have any suitable thickness such as a thickness of at least about 0.001 inches, preferably from about 0.001 to about 0.25 inches, more preferably between 0.001 and 0.15 inches and most preferably from 0.001 inches and 0.05 inches.

The first and second intermediate coating may be made of any one or more materials employed in conventional plasma processing chambers. Examples of such materials include metals, ceramics and polymers. Particularly desirable metals include refractory metals. Particularly desirable ceramics include $Al_2O_3$, SiC, $Si_3N_4$, BC, AlN, $TiO_2$, etc. Particularly desirable polymers include fluoropolymers such as polytetrafluoroethylene and polyimides. The intermediate coating or coatings can be applied by any known deposition technique such as plating (e.g., electroless plating or electroplating), sputtering, immersion coating, chemical vapor deposition, physical vapor deposition, electrophoretic deposition, hot isostatic pressing, cold isostatic pressing, compression molding, casting, compacting and sintering, and thermal spraying (e.g., plasma spraying).

It is contemplated that the first and second intermediate layers 80 and 90, which are optional may be any one of the above-mentioned materials such that the coatings are the same or different depending on the desired properties. Additional intermediate coatings such as a third, fourth or fifth intermediate coating of the same or different materials may also be provided between the coating and the substrate.

Figure 5:
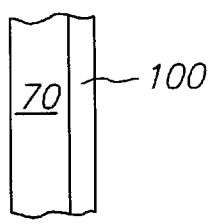
FIG. 5 shows details of another embodiment of the corrosion resistant according to the present invention.

FIG. 5 shows details of a second embodiment of the corrosion resistant coating. The zirconia toughened ceramic layer 90 can be deposited to a suitable thickness such as in the range of about 0.001 to about 1.0 inch, preferably 0.001 to 0.5 inch thick and most preferably 0.001 inches to 0.05 inches. The thickness of the ceramic layer can be selected to be compatible with the plasma environment to be encountered in the reactor (e.g., etching, CVD, etc.).

Although thermal spraying is a preferred method of providing components having zirconia toughened ceramic surfaces, other coating methods may also be employed. The zirconia toughened ceramic coating, for example, can also be applied by other deposition techniques such as sputtering, immersion coating, chemical vapor deposition, physical vapor deposition, hot isostatic pressing, cold isostatic pressing, compression molding, casting, and compacting and sintering.

The zirconia toughened ceramic material can also be provided in the form of preformed liners adapted to cover the exposed surfaces of reactor components. These liners can be attached by any known means including adhesive bonding or by the use of mechanical fasteners. When fasteners are used, the fasteners themselves, if exposed to the plasma, should also be made from an erosion resistant material. Additionally, the zirconia toughened ceramic liners may be designed to interlock with the underlying reactor component.

Figure 6:
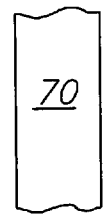
FIG. 6 shows details of a further embodiment of the corrosion resistant according to the present invention.

In yet another embodiment, components of semiconductor processing equipment are manufactured as monolithic bodies from zirconia toughened ceramic material. FIG. 6 illustrates a detail of the cross-section of a chamber liner 28 constructed as a monolithic body manufactured from a zirconia toughened ceramic material.

A method of manufacturing monolithic bodies from zirconia toughened ceramic material may include preparing a zirconia toughened ceramic containing slurry, forming a green compact in the desired shape, and sintering the compact. A desired shape is any plasma-exposed reactor component. Such components include chamber walls, substrate supports, gas distribution systems including showerheads, baffles, rings, nozzles, etc., fasteners, heating elements, plasma screens, liners, transport module components, such as robotic arms, fasteners, inner and outer chamber walls, etc., and the like. A specific example of such a component is the monolithic chamber liner 28 shown in FIG. 6. Details of ceramic processing techniques are given in *Introduction to Ceramics, 2nd Edition,* by W. D. Kingery, H. K. Bowen, and D. R. Uhlmann (J. Wiley & Sons, 1976), the contents of which are hereby incorporated by reference.

The zirconia toughened ceramic can be provided on all or part of the reactor chamber and components. In a preferred embodiment, the coating or covering is provided on the regions that can be exposed to the plasma environment such as parts in direct contact with the plasma or parts behind chamber components (e.g., liners). Additionally, it is preferred that the zirconia toughened ceramic layer be applied to regions that may be subjected to relatively high bias voltages (i.e. relatively high sputter ion energies).

By either applying a ceramic layer as a coating or covering or constructing a monolithic component in accordance with the invention, several advantages are realized. Namely, by employing zirconia toughened ceramics according to the present invention, lower erosion rates can be realized. Further, due to the transformation toughening of the zirconia toughened ceramic material, protective coatings according to the invention can have a reduced tendency to crack. As a result, the zirconia toughened ceramic components or coatings according to the present invention can decrease levels of metal and particulate contamination, lower costs by increasing the lifetime of consumables, and reduce the levels of corrosion of chamber parts.

While the invention has been described in detail with reference to specific embodiments thereof, it will be apparent to those skilled in the art that various changes and modifications can be made, and equivalents employed, without departing from the scope of the appended claims.

What is claimed is:

1. A component of semiconductor processing equipment, the component comprising an outermost surface formed by a zirconia toughened ceramic material consisting essentially of a tetragonal zirconia polycrystalline (TZP) material or partially-stabilized zirconia (PSZ), wherein the ceramic material is exposed to a plasma or to bias voltages associated with a plasma, and the ceramic material provides erosion resistance to the component with respect to the plasma and the bias voltages.

2. The component according to claim 1, wherein the ceramic material comprises a ceramic layer on a substrate.

3. The component according to claim 1, wherein the component comprises a part exposed to a plasma environment.

4. The component according to claim 1, wherein the component comprises a bulk part consisting essentially of the zirconia toughened ceramic material.

5. The component according to claim 1, wherein the component is selected from the group consisting of a plasms chamber wall, a chamber liner, a gas distribution plate, a gas ring, a pedestal, a dielectric window, an electrostatic chuck and a focus ring.

6. The component according to claim 1, wherein the ceramic material consists essentially of the tetragonal zirconia polycrystalline (TZP) material.

7. The component according to claim 1, wherein the ceramic material consists essentially of the partially-stabilized zirconia (PSZ).

8. The component according to claim 2, wherein the ceramic layer has a thickness in a range from about 0.001 to 0.050 inches.

9. A method of processing a semiconductor substrate in a plasma chamber containing the component of claim 1, the method comprising contacting an exposed surface of the semiconductor substrate with plasma.

10. A component of semiconductor processing equipment, the component comprising an outermost surface consisting essentially of tetragonal zirconia polycrystalline (TZP) material or partially stabilized zirconia (PSZ), wherein the component is selected from the group consisting of a plasma chamber wall, a chamber liner, a gas distribution plate, a gas ring, a pedestal, a dielectric window and a focus ring.

11. The component according to claim 10, wherein the component is a plasma chamber wall.

* * * * *